(12) United States Patent
Selinidis et al.

(10) Patent No.: US 8,012,395 B2
(45) Date of Patent: Sep. 6, 2011

(54) TEMPLATE HAVING ALIGNMENT MARKS FORMED OF CONTRAST MATERIAL

(75) Inventors: Kosta S. Selinidis, Austin, TX (US);
Byung-Jin Choi, Austin, TX (US);
Gerard M. Schmid, Austin, TX (US);
Ecron D. Thompson, Round Rock, TX (US); Ian Matthew McMackin, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 65 days.

(21) Appl. No.: 12/464,487

(22) Filed: May 12, 2009

(65) Prior Publication Data
US 2009/0250840 A1    Oct. 8, 2009

Related U.S. Application Data

(63) Continuation-in-part of application No. 11/693,236, filed on Mar. 29, 2007, now Pat. No. 7,547,398.

(60) Provisional application No. 61/104,300, filed on Oct. 10, 2008, provisional application No. 60/792,750, filed on Apr. 18, 2006.

(51) Int. Cl.
*B28B 11/08*    (2006.01)

(52) U.S. Cl. .......... 264/293; 264/400; 430/320; 216/72; 216/54; 216/100

(58) Field of Classification Search .................. 264/293, 264/400; 430/320; 216/72, 54, 100
See application file for complete search history.

(56) References Cited

U.S. PATENT DOCUMENTS

| | | | |
|---|---|---|---|
| 3,503,538 A | 3/1970 | Barnes |
| 4,022,855 A | 5/1977 | Hamblen |
| 4,070,116 A | 1/1978 | Frosch et al. |
| 4,208,240 A | 6/1980 | Latos |
| 4,364,971 A | 12/1982 | Sack et al. |
| 4,440,804 A | 4/1984 | Milgram |
| 4,512,848 A | 4/1985 | Deckman et al. |
| 4,521,445 A | 6/1985 | Nablo et al. |
| 4,552,832 A | 11/1985 | Blume et al. |
| 4,576,900 A | 3/1986 | Chiang |
| 4,637,904 A | 1/1987 | Rounds |
| 4,676,868 A | 6/1987 | Riley et al. |
| 4,707,218 A | 11/1987 | Giammarco et al. |
| 4,731,155 A | 3/1988 | Napoli et al. |
| 4,737,425 A | 4/1988 | Lin et al. |
| 4,848,911 A | 7/1989 | Uchida et al. |

(Continued)

FOREIGN PATENT DOCUMENTS

EP    0398589    4/1998

(Continued)

OTHER PUBLICATIONS

Johnson et al., Advances in Step and Flash Imprint Lithography, SPIE Microlithography Conference Feb. 23, 2003.

(Continued)

*Primary Examiner* — Joseph S Del Sole
*Assistant Examiner* — David N Brown, II
(74) *Attorney, Agent, or Firm* — Cameron A. King

(57) ABSTRACT

Imprint lithography substrates may include alignment marks formed of high contrast material. Exemplary methods for forming alignment marks having high contrast material are described.

17 Claims, 16 Drawing Sheets

U.S. PATENT DOCUMENTS

| | | | |
|---|---|---|---|
| 4,857,477 A | 8/1989 | Kanamori |
| 4,862,019 A | 8/1989 | Ashmore, Jr. |
| 4,866,307 A | 9/1989 | Ashmore, Jr. |
| 4,908,298 A | 3/1990 | Hefferon et al. |
| 4,909,151 A | 3/1990 | Fukui et al. |
| 4,919,748 A | 4/1990 | Bredbenner et al. |
| 4,921,778 A | 5/1990 | Thackeray et al. |
| 4,932,358 A | 6/1990 | Studley et al. |
| 4,936,465 A | 6/1990 | Zold |
| 4,957,663 A | 9/1990 | Zwiers et al. |
| 4,959,252 A | 9/1990 | Bonnebat et al. |
| 4,964,945 A | 10/1990 | Calhoun |
| 4,980,316 A | 12/1990 | Huebner |
| 5,003,062 A | 3/1991 | Yen |
| 5,028,361 A | 7/1991 | Fujimoto |
| 5,028,366 A | 7/1991 | Harakal et al. |
| 5,053,318 A | 10/1991 | Gulla et al. |
| 5,073,230 A | 12/1991 | Maracas et al. |
| 5,110,514 A | 5/1992 | Soane |
| 5,124,089 A | 6/1992 | Ohkoshi et al. |
| 5,126,006 A | 6/1992 | Cronin et al. |
| 5,148,037 A | 9/1992 | Suda et al. |
| 5,151,754 A | 9/1992 | Ishibashi et al. |
| 5,212,147 A | 5/1993 | Sheats |
| 5,232,874 A | 8/1993 | Rhodes et al. |
| 5,240,550 A | 8/1993 | Boehnke et al. |
| 5,240,878 A | 8/1993 | Fitzsimmons et al. |
| 5,244,818 A | 9/1993 | Jokerst et al. |
| 5,246,880 A | 9/1993 | Reele et al. |
| 5,250,472 A | 10/1993 | Chen et al. |
| 5,259,926 A | 11/1993 | Kuwabara et al. |
| 5,277,749 A | 1/1994 | Griffith et al. |
| 5,288,436 A | 2/1994 | Liu et al. |
| 5,324,683 A | 6/1994 | Fitch et al. |
| 5,328,810 A | 7/1994 | Lowrey et al. |
| 5,330,881 A | 7/1994 | Sidman et al. |
| 5,348,616 A | 9/1994 | Hartman et al. |
| 5,357,122 A | 10/1994 | Okubora et al. |
| 5,362,606 A | 11/1994 | Hartney et al. |
| 5,362,940 A | 11/1994 | MacDonald et al. |
| 5,364,222 A | 11/1994 | Akimoto et al. |
| 5,366,851 A | 11/1994 | Novembre |
| 5,371,822 A | 12/1994 | Horwitz et al. |
| 5,374,327 A | 12/1994 | Imahashi et al. |
| 5,376,810 A | 12/1994 | Hoenk et al. |
| 5,422,295 A | 6/1995 | Choi et al. |
| 5,424,549 A | 6/1995 | Feldman |
| 5,425,848 A | 6/1995 | Haisma et al. |
| 5,431,777 A | 7/1995 | Austin et al. |
| 5,434,107 A | 7/1995 | Paranjpe |
| 5,445,195 A | 8/1995 | Kim |
| 5,449,117 A | 9/1995 | Muderlak et al. |
| 5,451,435 A | 9/1995 | Yu |
| 5,453,157 A | 9/1995 | Jeng |
| 5,458,520 A | 10/1995 | DeMercurio et al. |
| 5,468,542 A | 11/1995 | Crouch |
| 5,477,058 A * | 12/1995 | Sato ............................. 250/548 |
| 5,480,047 A | 1/1996 | Tanigawa et al. |
| 5,512,131 A | 4/1996 | Kumar et al. |
| 5,542,605 A | 8/1996 | Campau |
| 5,545,367 A | 8/1996 | Bae et al. |
| 5,601,641 A | 2/1997 | Stephens |
| 5,612,068 A | 3/1997 | Kempf et al. |
| 5,628,917 A | 5/1997 | MacDonald et al. |
| 5,643,364 A | 7/1997 | Zhao et al. |
| 5,654,238 A | 8/1997 | Cronin et al. |
| 5,669,303 A | 9/1997 | Maracas et al. |
| 5,736,424 A | 4/1998 | Prybyla et al. |
| 5,753,014 A | 5/1998 | Van Rijn |
| 5,772,905 A | 6/1998 | Chou |
| 5,776,748 A | 7/1998 | Singhvi et al. |
| 5,804,474 A | 9/1998 | Sakaki et al. |
| 5,812,629 A | 9/1998 | Clauser |
| 5,817,579 A | 10/1998 | Ko et al. |
| 5,820,769 A | 10/1998 | Chou |
| 5,843,363 A | 12/1998 | Mitwalsky et al. |
| 5,849,209 A | 12/1998 | Kindt-Larsen et al. |
| 5,849,222 A | 12/1998 | Jen et al. |
| 5,858,580 A | 1/1999 | Wang et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,926,690 A | 7/1999 | Toprac et al. |
| 5,948,470 A | 9/1999 | Harrison et al. |
| 5,948,570 A | 9/1999 | Kornblit et al. |
| 5,956,216 A | 9/1999 | Chou |
| 5,974,150 A | 10/1999 | Kaish et al. |
| 5,983,906 A | 11/1999 | Zhao et al. |
| 6,046,056 A | 4/2000 | Parce et al. |
| 6,048,799 A | 4/2000 | Prybyla |
| 6,067,144 A | 5/2000 | Murouchi |
| 6,074,827 A | 6/2000 | Nelson et al. |
| 6,150,680 A | 11/2000 | Eastman et al. |
| 6,180,239 B1 | 1/2001 | Whitesides et al. |
| 6,218,316 B1 | 4/2001 | Marsh |
| 6,242,363 B1 | 6/2001 | Zhang |
| 6,245,213 B1 | 6/2001 | Olsson et al. |
| 6,274,294 B1 | 8/2001 | Hines |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,337,262 B1 | 1/2002 | Pradeep et al. |
| 6,348,999 B1 | 2/2002 | Summersgill et al. |
| 6,355,198 B1 | 3/2002 | Kim et al. |
| 6,376,379 B1 | 4/2002 | Quek et al. |
| 6,379,573 B1 | 4/2002 | Kim et al. |
| 6,383,928 B1 | 5/2002 | Eissa |
| 6,387,330 B1 | 5/2002 | Bova et al. |
| 6,387,783 B1 | 5/2002 | Furukawa et al. |
| 6,388,253 B1 | 5/2002 | Su |
| 6,391,217 B2 | 5/2002 | Schaffer et al. |
| 6,391,798 B1 | 5/2002 | DeFelice et al. |
| 6,423,207 B1 | 7/2002 | Heidari et al. |
| 6,482,742 B1 | 11/2002 | Chou |
| 6,495,907 B1 | 12/2002 | Jain et al. |
| 6,498,640 B1 | 12/2002 | Ziger |
| 6,503,829 B2 | 1/2003 | Kim et al. |
| 6,514,672 B2 | 2/2003 | Young et al. |
| 6,517,977 B2 | 2/2003 | Resnick et al. |
| 6,517,995 B1 | 2/2003 | Jacobson et al. |
| 6,518,189 B1 | 2/2003 | Chou |
| 6,521,536 B1 | 2/2003 | Robinson |
| 6,534,418 B1 | 3/2003 | Plat et al. |
| 6,541,360 B1 | 4/2003 | Plat et al. |
| 6,565,928 B2 | 5/2003 | Sakamoto et al. |
| 6,580,172 B2 | 6/2003 | Mancini et al. |
| 6,586,268 B1 | 7/2003 | Kopola et al. |
| 6,593,240 B1 | 7/2003 | Page |
| 6,621,960 B2 | 9/2003 | Wang et al. |
| 6,623,579 B1 | 9/2003 | Smith et al. |
| 6,627,544 B2 | 9/2003 | Izumi et al. |
| 6,629,292 B1 | 9/2003 | Corson et al. |
| 6,632,742 B2 | 10/2003 | Yang et al. |
| 6,635,581 B2 | 10/2003 | Wong |
| 6,646,662 B1 | 11/2003 | Nebashi et al. |
| 6,665,014 B1 | 12/2003 | Assadi et al. |
| 6,677,252 B2 | 1/2004 | Marsh |
| 6,678,038 B2 | 1/2004 | Binnard |
| 6,696,220 B2 | 2/2004 | Bailey et al. |
| 6,713,238 B1 | 3/2004 | Chou et al. |
| 6,719,915 B2 | 4/2004 | Willson et al. |
| 6,776,094 B1 | 8/2004 | Whitesides et al. |
| 6,809,356 B2 | 10/2004 | Chou |
| 6,828,244 B2 | 12/2004 | Chou |
| 6,833,325 B2 | 12/2004 | Huang et al. |
| 6,842,229 B2 | 1/2005 | Sreenivasan et al. |
| 6,849,558 B2 | 2/2005 | Schaper |
| 6,870,301 B2 | 3/2005 | Choi et al. |
| 6,871,558 B2 | 3/2005 | Choi et al. |
| 6,873,087 B1 | 3/2005 | Choi et al. |
| 6,879,162 B2 | 4/2005 | Aguero et al. |
| 6,900,881 B2 | 5/2005 | Sreenivasan et al. |
| 6,902,853 B2 | 6/2005 | Sreenivasan et al. |
| 6,908,861 B2 | 6/2005 | Sreenivasan et al. |
| 6,916,584 B2 | 7/2005 | Sreenivasan et al. |

| | | |
|---|---|---|
| 6,916,585 B2 | 7/2005 | Sreenivasan et al. |
| 6,921,615 B2 | 7/2005 | Sreenivasan et al. |
| 6,922,906 B2 | 8/2005 | Choi et al. |
| 6,926,929 B2 | 8/2005 | Watts et al. |
| 6,929,762 B2 | 8/2005 | Rubin |
| 6,932,934 B2 | 8/2005 | Choi et al. |
| 6,946,360 B2 | 9/2005 | Chou |
| 6,954,275 B2 | 10/2005 | Choi et al. |
| 6,955,767 B2 | 10/2005 | Chen |
| 6,964,793 B2 | 11/2005 | Willson et al. |
| 6,990,870 B2 | 1/2006 | Choi et al. |
| 6,994,808 B2 | 2/2006 | Lee et al. |
| 7,027,156 B2 | 4/2006 | Watts et al. |
| 7,029,944 B1 | 4/2006 | Conley, Jr. et al. |
| 7,060,324 B2 | 6/2006 | Bailey et al. |
| 7,070,405 B2 | 7/2006 | Sreenivasan et al. |
| 7,071,088 B2 | 7/2006 | Watts et al. |
| 7,077,992 B2 | 7/2006 | Sreenivasan et al. |
| 7,090,716 B2 | 8/2006 | McMackin et al. |
| 7,105,452 B2 | 9/2006 | Sreenivasan |
| 7,117,583 B2 | 10/2006 | Dinan et al. |
| 7,128,875 B2 | 10/2006 | Cubicciotti |
| 7,136,150 B2 | 11/2006 | Sreenivasan et al. |
| 7,170,589 B2 | 1/2007 | Cherala et al. |
| 7,186,483 B2 | 3/2007 | Sreenivasan et al. |
| 7,214,624 B2 | 5/2007 | Fujita et al. |
| 7,244,386 B2 | 7/2007 | Sreenivasan et al. |
| 7,252,715 B2 | 8/2007 | Watts et al. |
| 7,270,533 B2 | 9/2007 | McMackin et al. |
| 7,281,921 B2 | 10/2007 | Watts et al. |
| 7,292,326 B2 | 11/2007 | Nimmakayala et al. |
| 7,303,383 B1 | 12/2007 | Sreenivasan et al. |
| 7,323,130 B2 | 1/2008 | Nimmakayala et al. |
| 7,338,275 B2 | 3/2008 | Choi et al. |
| 7,365,103 B2 | 4/2008 | Willson et al. |
| 7,531,025 B2 | 5/2009 | McMackin et al. |
| 7,670,529 B2 | 3/2010 | Choi et al. |
| 2001/0023829 A1 | 9/2001 | Olsson et al. |
| 2002/0038916 A1 | 4/2002 | Chiu et al. |
| 2002/0042027 A1 | 4/2002 | Chou et al. |
| 2002/0094496 A1 | 7/2002 | Choi et al. |
| 2002/0110992 A1 | 8/2002 | Ho |
| 2002/0111036 A1 | 8/2002 | Zhu et al. |
| 2002/0132482 A1 | 9/2002 | Chou |
| 2002/0167117 A1 | 11/2002 | Chou |
| 2002/0168578 A1 | 11/2002 | Wang et al. |
| 2002/0170880 A1 | 11/2002 | Chen |
| 2002/0191141 A1 | 12/2002 | Liao |
| 2003/0025895 A1 | 2/2003 | Binnard |
| 2003/0034329 A1 | 2/2003 | Chou |
| 2003/0062334 A1 | 4/2003 | Lee et al. |
| 2003/0080471 A1 | 5/2003 | Chou |
| 2003/0080472 A1 | 5/2003 | Chou |
| 2003/0081193 A1 | 5/2003 | White et al. |
| 2003/0092261 A1 | 5/2003 | Kondo et al. |
| 2003/0129542 A1 | 7/2003 | Shih et al. |
| 2003/0137494 A1 | 7/2003 | Tulbert |
| 2003/0151714 A1 | 8/2003 | Takahashi et al. |
| 2003/0174435 A1 | 9/2003 | Dinan et al. |
| 2003/0179354 A1 | 9/2003 | Araki et al. |
| 2003/0180631 A1 | 9/2003 | Shiota et al. |
| 2003/0184917 A1 | 10/2003 | Chang et al. |
| 2003/0186140 A1 | 10/2003 | Fries |
| 2003/0197312 A1 | 10/2003 | Hougham et al. |
| 2003/0224116 A1 | 12/2003 | Chen et al. |
| 2004/0029041 A1 | 2/2004 | Shih et al. |
| 2004/0036201 A1 | 2/2004 | Chou et al. |
| 2004/0046288 A1 | 3/2004 | Chou |
| 2004/0065252 A1 | 4/2004 | Sreenivasan et al. |
| 2004/0065976 A1 | 4/2004 | Sreenivasan et al. |
| 2004/0095656 A1 | 5/2004 | Lee et al. |
| 2004/0110856 A1 | 6/2004 | Young et al. |
| 2004/0118809 A1 | 6/2004 | Chou et al. |
| 2004/0131718 A1 | 7/2004 | Chou et al. |
| 2004/0137734 A1 | 7/2004 | Chou et al. |
| 2004/0141163 A1 | 7/2004 | Bailey et al. |
| 2004/0149687 A1 | 8/2004 | Choi et al. |
| 2004/0156108 A1 | 8/2004 | Chou et al. |
| 2004/0163563 A1 | 8/2004 | Sreenivasan et al. |
| 2004/0192041 A1 | 9/2004 | Jeong et al. |
| 2004/0197843 A1 | 10/2004 | Chou et al. |
| 2004/0201890 A1 | 10/2004 | Crosby |
| 2004/0250945 A1 | 12/2004 | Zheng at al. |
| 2005/0037143 A1 | 2/2005 | Chou et al. |
| 2005/0056963 A1 | 3/2005 | McCutcheon |
| 2005/0061773 A1 | 3/2005 | Choi et al. |
| 2005/0064344 A1 * | 3/2005 | Bailey et al. .................. 430/320 |
| 2005/0187339 A1 | 8/2005 | Xu et al. |
| 2005/0189676 A1 | 9/2005 | Sreenivasan |
| 2005/0236739 A1 | 10/2005 | Willson et al. |
| 2005/0269745 A1 | 12/2005 | Cherala et al. |
| 2005/0270312 A1 | 12/2005 | Lad et al. |
| 2005/0270516 A1 | 12/2005 | Cherala et al. |
| 2005/0271955 A1 | 12/2005 | Cherala et al. |
| 2005/0284886 A1 | 12/2005 | Penciu |
| 2006/0017876 A1 | 1/2006 | Watts |
| 2006/0019183 A1 | 1/2006 | Voisin |
| 2006/0049455 A1 | 3/2006 | Jang et al. |
| 2006/0062922 A1 | 3/2006 | Xu et al. |
| 2006/0076717 A1 | 4/2006 | Sreenivasan et al. |
| 2006/0077374 A1 | 4/2006 | Sreenivasan et al. |
| 2006/0113697 A1 | 6/2006 | Sreenivasan |
| 2006/0114450 A1 | 6/2006 | Nimmakayala et al. |
| 2006/0114558 A1 | 6/2006 | Shimizu |
| 2006/0115999 A1 | 6/2006 | Sreenivasan et al. |
| 2007/0126150 A1 | 6/2007 | GanapathiSubramanian et al. |
| 2007/0132152 A1 | 6/2007 | Choi et al. |
| 2007/0170617 A1 | 7/2007 | Choi et al. |
| 2007/0228609 A1 | 10/2007 | Sreenivasan et al. |
| 2007/0228610 A1 | 10/2007 | Sreenivasan et al. |
| 2007/0231421 A1 | 10/2007 | Nimmakayala et al. |
| 2007/0231981 A1 | 10/2007 | Sreenivasan et al. |
| 2007/0243655 A1 | 10/2007 | Schmid et al. |
| 2008/0067721 A1 | 3/2008 | Yu |
| 2008/0141862 A1 | 6/2008 | Xu et al. |
| 2008/0153312 A1 | 6/2008 | Sreenivasan et al. |
| 2008/0174046 A1 | 7/2008 | Choi et al. |
| 2008/0199816 A1 | 8/2008 | Choi et al. |
| 2008/0211133 A1 * | 9/2008 | Terasaki et al. ................ 264/219 |
| 2009/0026657 A1 | 1/2009 | Nimmakayala et al. |
| 2009/0147237 A1 | 6/2009 | Schumaker et al. |
| 2009/0148032 A1 | 6/2009 | Schumaker et al. |
| 2010/0053578 A1 | 3/2010 | Sreenivasan et al. |

FOREIGN PATENT DOCUMENTS

| | | |
|---|---|---|
| EP | 1760526 A1 | 3/2007 |
| FR | 2677043 A1 | 12/1992 |
| JP | 3-32888 | 2/1981 |
| JP | 58-129074 | 8/1983 |
| JP | 60111425 A | 6/1985 |
| JP | 1-196749 | 8/1989 |
| JP | 02-24848 | 1/1990 |
| JP | 02-92603 | 4/1990 |
| JP | 02192045 | 7/1990 |
| JP | 4-70379 | 5/1992 |
| JP | 1731963 A2 | 12/2006 |
| WO | WO 87/02935 | 5/1987 |
| WO | WO 98/10121 | 3/1998 |
| WO | WO 99/05724 | 2/1999 |
| WO | WO 99/45753 | 9/1999 |
| WO | WO 00/21689 | 4/2000 |
| WO | WO 01/47003 | 6/2001 |
| WO | WO 01/63361 | 8/2001 |
| WO | WO 01/69317 | 9/2001 |
| WO | WO 01/79589 | 10/2001 |
| WO | WO 01/79933 | 10/2001 |
| WO | WO 02/22916 | 3/2002 |
| WO | WO 02/24977 | 3/2002 |

OTHER PUBLICATIONS

Chou et al., Lithographically Induced Self-assembly of Periodic Polymer Micropillar Arrays, J Vac. Sci. Technol. B 17 (6), pp. 3197-3202 Nov. 1, 1999.

Colburn et al., Step and Flash Imprint Lithography. A New Approach to High-Resolution Patterning, Proc. Of SPIE, vol. 3676 Mar. 1, 1999.

Wu, Large Area High Density Quantized Magnetic Disks Fabricated

Using Nanoimprint Lithography, J. Vac. Sci. Technol. B 16(6): pp. 3825-3829 Nov. 1, 1998.
Gokan et al., Dry Etch Resistance of Organic Materials, J. Electrochem. Soc.: Solid-State Science and Technology, pp. 143-146 Jan. 1, 1983.
Chou, Nanoimprint Lithography and Lithographically Induced Self-Assembly, MRS Bulletin, pp. 512-517 Jul. 1, 2001.
Braeuer et al., Precise Polymer Micro-Optical Systems, MRS Bulletin, pp. 519-522 Jul. 1, 2001.
Choi et al., Design of Orientation Stages for Step and Flash Imprint Lithography, Precision Engineering, pp. 192-199 Jan. 1, 2001.
Ruchhoeft et al, Patterning Curved Surfaces: Template Generation by Ion Beam Proximity Lithography and Relief Transfer by Step and Flash Imprint Lithography. Journal of Vacuum Science and Technology, pp. 1-17 Jan. 1, 2000.
Xia et al., Soft Lithography, Angew Chem. Int Ed., pp. 550-575 Jan. 1, 1998.
Chou et al., Imprint Lithography with Sub-10 nm Feature Size and High Throughput, Microelectronic Engineering 35, pp. 237-240 Jan. 1, 1997.
Haisma et al., Mold-assisted Nanalithography: A Process for Reliable Pattern Replication, J. Vac. Sci Technol B, pp. 4124-4128 Nov. 1, 1996.
Xia et al., Soft Lithography, Annu Rev. Mater Sci. 1998 28: 153-184 Jan. 1, 1998.
Chou et al., Imprint of Sub-25 nm Vias and Trenches in Polymers, Appl. Phys. Lett. 67 (21) Nov. 20, 1995.
Otto et al., Characterization and Application of a UV-based Imprint Technique, Microelectronic Engineering 57-58, pp. 361-366 Jan. 1, 2001.
Nguyen, Asymmetric Fluid-Structure Dynamics in Nanoscale Imprint Lithography, The University of Texas at Austin, pp. 1-111 Aug. 1, 2001.
Colburn et al., Step and Flash Imprint Lithography for sub-100 nm Patterning, Proceedings of SPIE vol. 3997, pp. 453-457 Jan. 1, 2000.
Chou et al., Imprint Lithography with 25-Nanometer Resolution, Science vol. 272, pp. 85-87 Apr. 5, 1996.
Heidari, Nanoimprint Lithography at the 6 in. Wafer Scale, J Vac Sci. Technol. B 18(6), pp. 3557-3560 Nov. 1, 2000.
Abstract of Japanese Patent 02-92603, Aug. 12, 2004.
Translation of Japanese Patent 02-92603, Apr. 3, 1990.
Translation of Japanese Patent 02-24848, Jan. 26, 1990.
Abstract of Japanese Patent 02-24848, Jan. 26, 1990.
Otto et al., Reproducibility and Homogeneity in Step and Repeat UV-Nanoimprint Lithography, Microelectronic Engineering 73-74, pp. 152-166 Jan. 1, 2004.
Kawata et al., Imprint/Photo Hybrid Litography Using Conventional Contact Aligner, Japanese Journal of Applied Physics, vol. 43, No. 6B, pp. 4027-4030 Jun. 29, 2004.
Kim et al., Reducing Photocurable Polymer Pattern Shrinkage and Roughness during Dry Etching in Photo-Nanoimprint Litography, Japanese Journal of Applied Physics, vol. 43, No. 6B, pp. 4022-4026 Jun. 29, 2004.
Abstract of Japanese Patent 58-129074, Aug. 1, 1983.
Chou et al., Ultrafast and Direct Imprint of Nanostructures in Silicon, Nature, Col. 417, (Jun. 2002), pp. 835-837 Jun. 1, 2002.
Chou et al., Nanoimprint Lithography, Journal of Vacuum Science Technolgoy B 14(16), pp. 4129-4133 Nov. 1, 1996.
Colburn et al., Development and Advantages of Step-and-Flash Lithography, Solid State Technology Jul. 1, 2001.
Colburn et al., Characterization and Modeling of Volumetric and Mechanical Properties for Step and Flash Imprint Lithography Photopolymers, Journal of Vacuum Science Technology. vol. b. 19(6) Nov. 1, 2001.
Wilson et al., Lithography and Etch Issues, Handbook of Multilevel Metallization for integrated Circuits, pp. 566-567 Jan. 1, 1993.
Bailey et al., Step and Flash Imprint Lithography: Defect Analysis, Journal of Vacuum Science, B 19(6), pp. 2806-2810 Nov. 1, 2001.
Bailey et al., Step and Flash Imprint Lithography: Template Surface Treatment and Defect Analysis, Journal of Vacuum Science, B 18(6), pp. 3572-3577 Nov. 1, 2000.
Schneider et al., Stripes of Partially Fluorinated Alkyl Chains: Dipolar Langmuir Monolayers, J. Chem. Phys. vol. 122, Issue 9 Mar. 1, 2005.
Park et al., Aligning Liquid Crystals Using Replicated Nanopatterns, PSI Scientific Report 2002, vol. VII, p. 85 Mar. 1, 2003.
Thompson et al, Fabrication of Step and Flash Imprint Lithography Templates Using Commercial Mask Processes, SPIE Microlithography Conference Feb. 1, 2003.
McMackin et al., Design and Performance of a Step and Repeat Imprinting Machine, SPIE Microltihgraphy Conference Feb. 1, 2003.
Le et al., Development of an Etch-Definable Lift-Off Process for Use with Step and Flash Imprint Lithography, SPIE Microlithography Conference Feb. 1, 2005.
Choi et al., Layer-to-Layer Alignment for Step and Flash Imprint Lithography, SPIE's 26th Intl. Symp. Microlithography: Emerging Lithographic Technologies, Santa Clara, CA Mar. 1, 2001.
Cardinale et al., Fabrication of a Surface Acoustic Wave-Based Correlator Using Step-and-Flash Imprint Lithography, J. Vac. Sci. Technol. B 22(6) Nov. 1, 2004.
Abstract of Japanese Patent 3-32888, Feb. 13, 1991.
Bien et al., Characterization of Masking Materials for Deep Glass Micromachining, J. Micromech. Microeng. 13 pp. S34-S40 Jan. 1, 2003.
Tsukamoto et al., High Sensitivity Pixel Technology for a 1/4 inch PAL 430k pixel IT-CCD, IEE Custom Integrated Circuits Conference Jan. 1, 1996.
Abstract of French Patent 2677043, Dec. 1, 1992.
Colburn, Dissertation for the Degree of Doctor of Philosophy, Step and Flash Imprint Lithography: A Low-Pressure, Room-Temperature Nanoimprint Lithography Aug. 1, 2001.
Thurn et al., Stress Hysteresis and Mechanical Properties of Plasma-Enhanced Chemical Vapor Deposited Dielectric Films, Journal of Applied Physics, vol. 95, No. 3, pp. 967-976 Feb. 1, 2004.
Modreanu et al., Optical Properties of LPCVD Silicon Oxynitride, Thin Solid Films 337, pp. 82-84.
Casey et al., Control of Metal Deposition in a Web Coater, Controlling in both Transverse and Machine Direction, Proceedings, Annual Technical Conference—Society of Vacuum Coaters May 4, 1990.
Lu et al., The Effect of Deposition Parameters on Performance of VME-FPC, Proceedings of the IEEE International Vacuum Microelectronics Conference, IVMC Aug. 16, 2001.
Abstract of Japanese patent 02-192045, Jul. 27, 1990.
PCT/US2007/08433 International Search Report, Aug. 13, 2008.
PCT/US2009/005586 International Search Report, Dec. 4, 2009.
PCT/US2009/002959 International Search Report, Mar. 31, 2009.

* cited by examiner

TEMPLATE HAVING ALIGNMENT MARKS FORMED OF CONTRAST MATERIAL

CROSS-REFERENCE TO RELATED APPLICATIONS

This application claims the benefit under 35 U.S.C. §119 (e)(1) of U.S. Provisional No. 61/104,300, filed Oct. 10, 2008, which is hereby incorporated by reference. This application is a Continuation-In-Part of U.S. Ser. No. 11/693,236, filed on Mar. 29, 2007, which claims priority to U.S. Provisional No. 60/792,750, filed on Apr. 18, 2006, both of which are hereby incorporated by reference herein in their entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent, includes formation of a relief pattern in a polymerizable layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF SEVERAL VIEWS OF THE DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
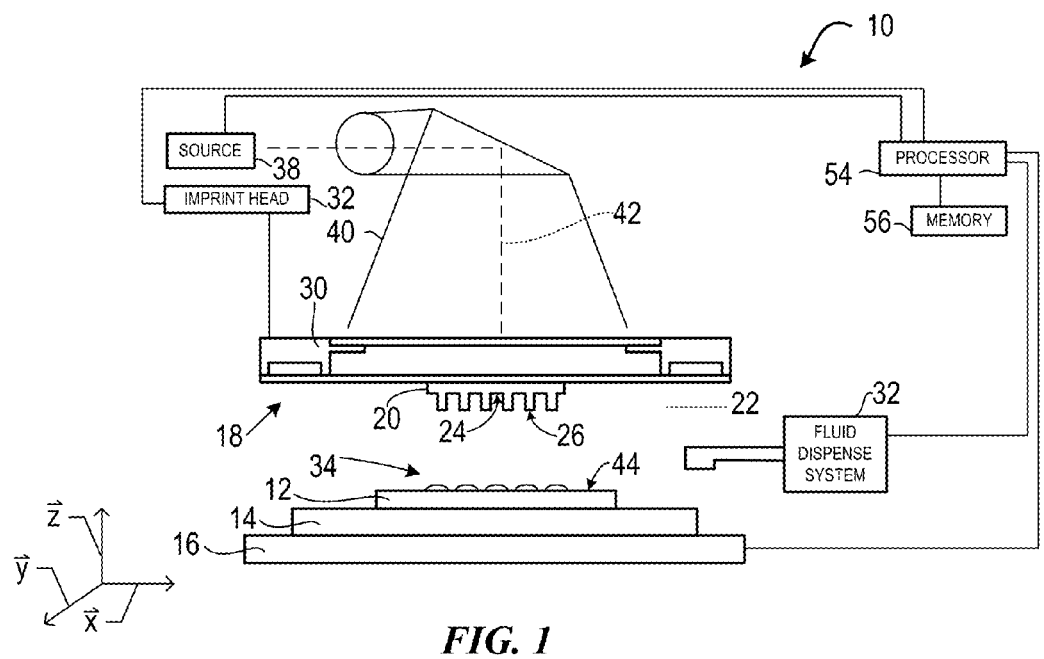
FIG. 1 illustrates a simplified side view of one embodiment of a lithographic system in accordance with the present invention.

Referring to the figures, and particularly to FIG. 1, illustrated therein is a lithographic system 10 used to form a relief pattern on a substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 22 and substrate 12 depending on design considerations. Polymerizable material 34 may comprise a monomer mixture as described in U.S. Pat. No. 7,157,036 and U.S. Patent Publication No. 2005/0187339, all of which are hereby incorporated by reference.

Figure 2:
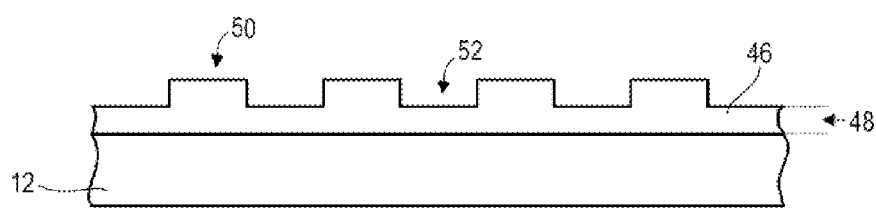
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both may vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

One manner in which to locate the polymerizable material 34 between template 18 and substrate 12 may be by depositing a plurality of droplets of polymerizable material 34 on the surface of substrate 12. Thereafter, polymerizable material 34 may be concurrently contacted by both template 18 and substrate 12, spreading polymerizable material 34 on the surface of substrate 12. During this process, orientation of template 18 to substrate 12 may become a factor.

Figure 3A:
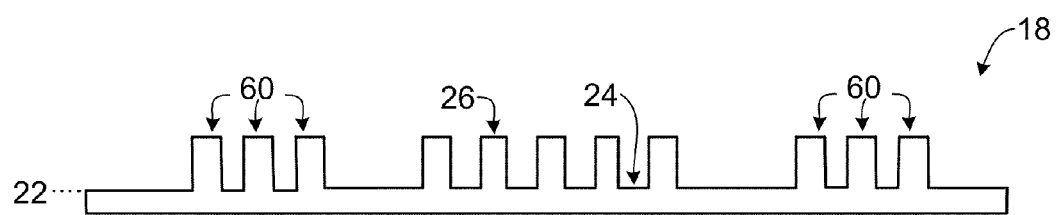
FIGS. 3A and 3B illustrate exemplary embodiments of templates having alignment marks.
Figure 3B:
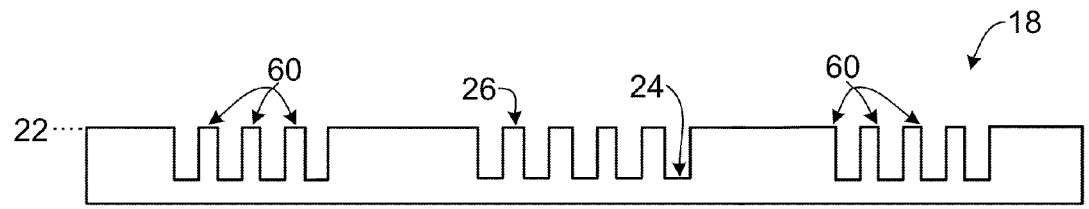

Referring to FIG. 3, template 18 and/or substrate 12 may include alignment marks 60 to provide suitable orientation. Alignment marks 60 may be formed on patterning surface 22 of template 18 and/or substrate 12 or etched into template 18 and/or substrate 12 as illustrated in FIG. 3B.

Figure 4:
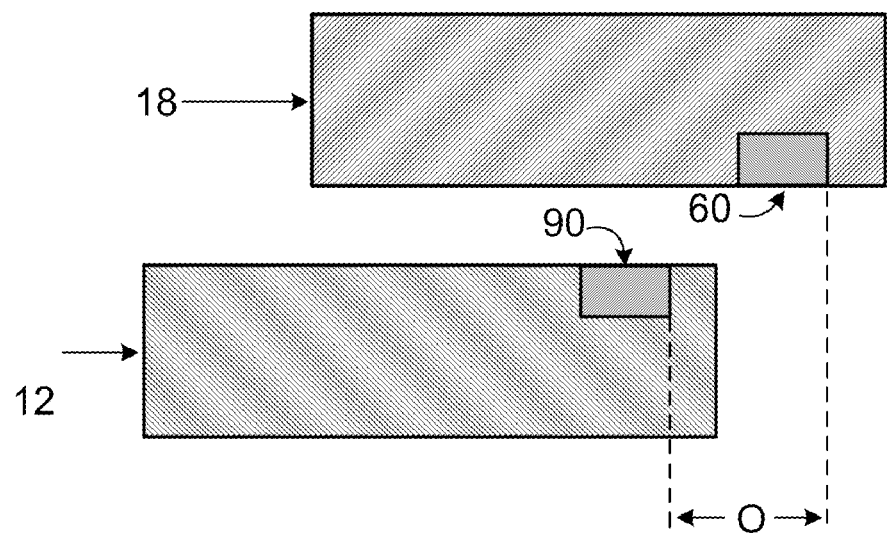
FIG. 4 illustrates a simplified elevation view of the template in superimposition with the substrate, both shown in FIG. 1, showing misalignment along one direction.
Figure 5:
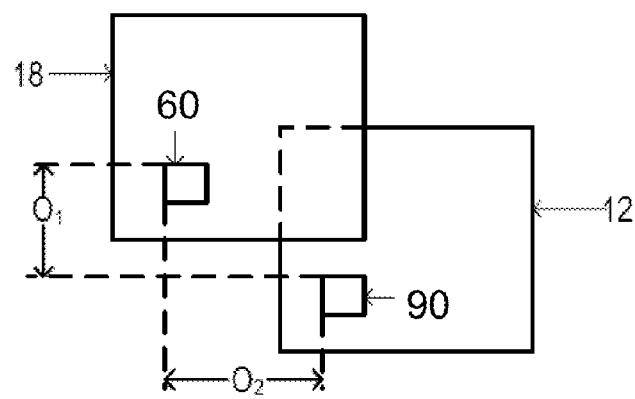
FIG. 5 illustrates a simplified elevation view of the template in superimposition with the substrate, both shown in FIG. 1, showing misalignment along one direction.
Figure 6:
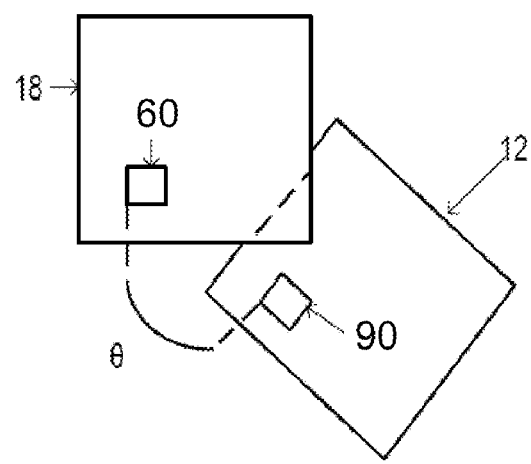
FIG. 6 illustrates a top down view of the template in superimposition with the substrate, both shown in FIG. 1, showing misalignment along two transverse directions.

Referring to FIG. 4, it is assumed that desired alignment between template 18 and substrate 12 occurs upon alignment mark 60 of the template 18 being in superimposition with alignment mark 90 of the substrate 12. For example, in FIG. 4, desired alignment between template 18 and substrate 12 has not occurred, shown by the two marks being offset a distance O. Further, although offset O is shown as being a linear offset in one direction, it should be understood that the offset may be linear along two directions shown as $O_1$ and $O_2$ in FIG. 5. In addition to, or instead of, the aforementioned linear offset in one or two directions, the offset between template 18 and substrate 12 may also consist of an angular offset, shown in FIG. 6 as angle $\Theta$. Multiple alignment masks may also have other offsets in combination (e.g., magnification, skew, trapezoidal distortions, and the like).

The material comprising template 18 may have the same indices of refraction as polymerizable material 34. Even further, the indices of refraction may be in the range of wavelengths used for the alignment process. Alignment marks 60 of template 18 having the same indices of refraction as polymerizable material 34 may cause alignment marks 60 of template 18 to be invisible during the alignment process when in contact with polymerizable material 34. Invisibility of alignment marks 60 of template 18 may hinder the alignment process between template 18 and substrate 12 for patterning of polymerizable material 34.

Isolation of the alignment marks 60 of template 18 and/or substrate 12 from polymerizable material 34 may facilitate visibility during the alignment process. For example, a moat (not shown) may be etched into template 18 during the pedestal making process to isolate polymerizable material 34 from alignment marks 60. Moats, channels, and other similar features are further described in U.S. Ser. No. 10/917,761, U.S. Pat. No. 7,077,992, U.S. Pat. No. 7,041,604, U.S. Pat. No. 6,916,584, and U.S. Pat. No. 7,252,777, which are hereby incorporated by reference. The minimum required space needed for such features, however, may generally be large due to the width of the moat and/or channel, and the distance that may be needed between alignment marks 60 and the edges of mold 20.

Instead of isolating alignment marks 60 from polymerizable material 34, alignment marks 60 may be formed to provide visibility during the alignment process. For simplicity in description, the following describes formation and use of template alignment marks, however, as one skilled in art would recognize, alignment marks having characteristics and formations as described herein may be provided in substrate 12. FIGS. 7A-7E illustrate side views of embodiments of template 18a that include alignment marks 60a visible during the alignment process. Generally, alignment marks 60a may be formed of a high contrast material. High contrast materials may include, but are not limited to, tantalum, tantalum nitride, tungsten, silicon carbide, amorphous silicon, chromium, chromium nitride, molybdenum, molybdenum silicide, titanium, titanium nitride, combinations of these materials and/or the like.

High contrast materials may have an optical density suitable for use in alignment marks 60a when provided at thicknesses less than the thickness of patterned layer 48 (e.g., less than 25 nm) illustrated in FIG. 2. For example, a layer of high contrast material in alignment mark 60a may be such that at least a portion of alignment mark 60a resides in polymerizable material 34 during formation of patterned layer 48, and thus alignment mark 60a may not limit proximity of substrate 12 to surface of template 18.

Alignment marks 60a may be visible during the alignment process with or without the use of a trench or other similar isolation means. Alignment marks 60a may be embedded within mold 20, as illustrated in FIG. 7A, positioned on patterning surface 22a of mold 20, as illustrated by FIG. 7C, or a combination of both on patterning surface 22a and imbedded within mold 20.

Figure 7A:
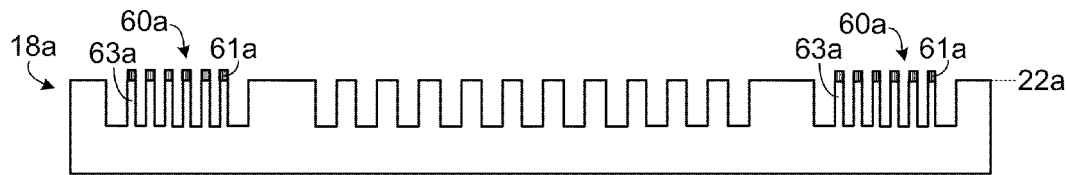
FIGS. 7A-7E illustrate exemplary embodiments of templates having alignment marks that are visible during an alignment process.
Figure 7B:
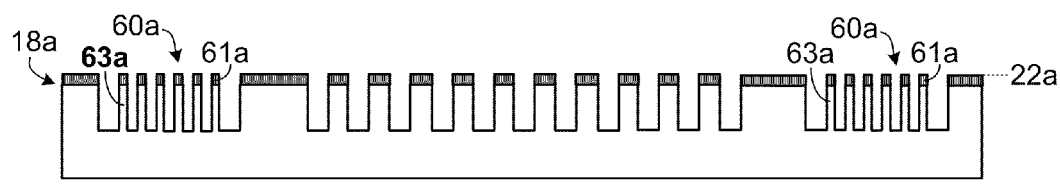
Figure 7C:
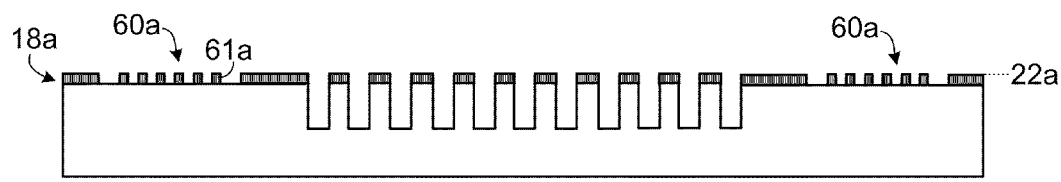
Figure 7D:
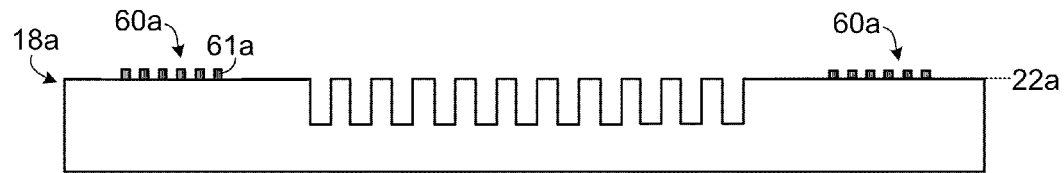
Figure 7E:
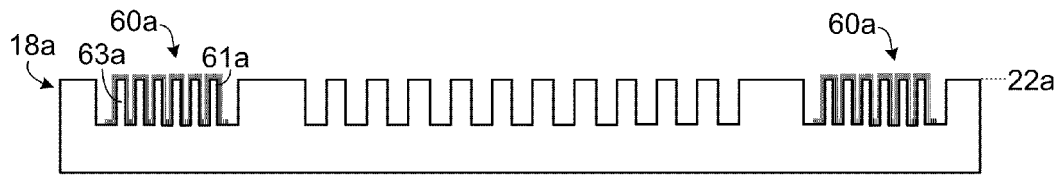

FIGS. 7A-7E illustrate variations of template 18a having visible alignment marks 60a during the patterning process. For example, in FIGS. 7A and 7B, a first portion 61a of alignment marks 60a may be formed of high contrast material while a second portion 63a is substantially absent of high contrast material. The first portion may be integral to alignment mark 60a, or as illustrated in FIGS. 7A and 7B, the first portion may be localized. For example, as illustrated in FIG. 7A, the first portion having high contrast material may be localized at patterning surface 22a. Alternatively, as illustrated in FIG. 7E, high contrast material may be used to substantially coat alignment marks 60a.

As illustrated in FIGS. 7B and 7C, high contrast material may be applied throughout template 18b and not localized on alignment marks 60a. For example, high contrast material may coat patterning surface 48a of template 18b. Alternatively, high contrast material may be integral within template 18b.

FIGS. 8A-8K illustrate simplified side views of exemplary formation of template 18a having high-contrast alignment marks 60a. For example, template 18a may be formed from a multi-layer substrate 64 and comprise mesa 20a having high-contrast alignment marks 60a. Contrast material used to form alignment marks 60a may be generally compatible with the imprint process used currently within the industry, and as such, contrast material may be cleaned after imprinting without substantial damage. Additionally, formation of alignment marks 60a may be within the same processing step as formation of features 24a and/or 24b. Formation within the same processing step may reduce overlay alignment error.

Figure 8A:
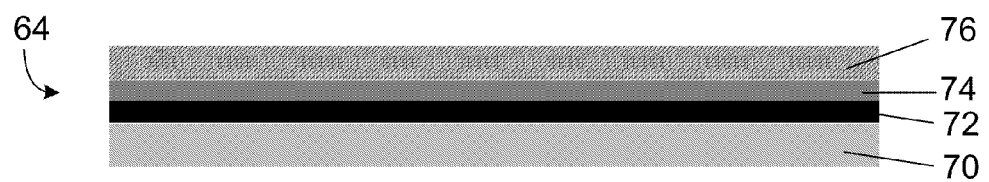
FIGS. 8A-8K illustrate one embodiment of exemplary template formation having alignment marks that are visible during an alignment process.

As illustrated in FIG. 8A, multi-layer substrate 64 may generally comprise a substrate layer 70, a contrast material layer 72, a hard mask layer 74, and resist 76. Substrate layer 70 may be formed from materials including, but not limited to, quartz, silicon, organic polymers, siloxane polymers, borosilicate glass, fluorocarbon polymers, metal, hardened sapphire, and/or the like.

Hard mask layer 74 may be formed from materials including, but not limited to, tantalum, tantalum nitride, tungsten, silicon carbide, amorphous silicon, chromium, chromium nitride, molybdenum, molybdenum silicide, titanium, titanium nitride, and/or the like.

Contrast material layer 72 may be formed from materials including, but not limited to, tantalum, tantalum nitride, tungsten, silicon carbide, amorphous silicon, chromium, chromium nitride, molybdenum, molybdenum silicide, titanium, titanium nitride, combinations of these materials and/or the like. It should be noted contrast material layer 72 may serve a dual purpose in that contrast material layer 72 may provide high contrast material for visibility of alignment mark during patterning of substrate 12 and also serve as a hard mask layer in addition to or in lieu of hard mask layer 74.

Figure 8B:
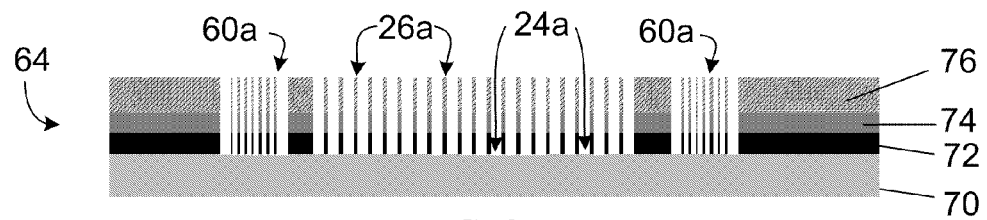
Figure 8C:
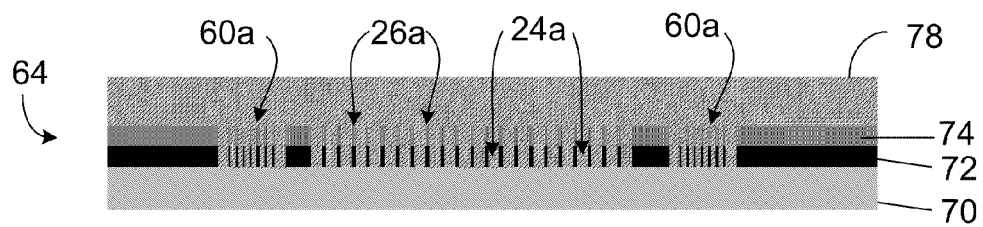

Referring to FIG. 8B, contrast material layer 72, hard mask layer 74, and resist 76 may be patterned to include primary features (e.g., recessions 24a and protrusions 26a) and/or alignment marks 60a. Multi-layer substrate 64 may be further substantially removed of resist 76 and recoated with resist 78 as shown in FIG. 8C. For example, resist 76 may be removed using techniques including, but not limited to, resist strip and solvent wet processes, oxygen ash etch processes, UV ozonated processes, ozonated water, and the like. It should be noted that the multi-layer substrate 64 may be coated with resist 78 without complete removal of resist 76.

Figure 8D:
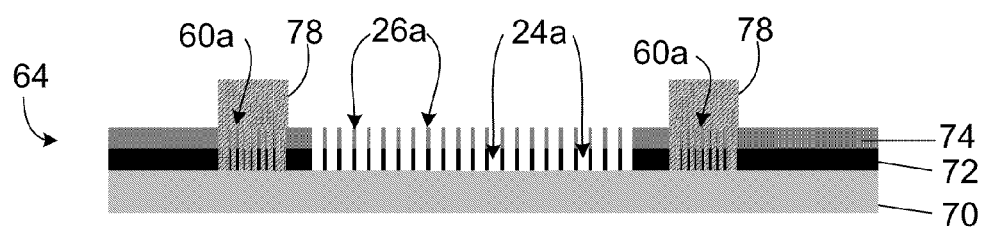

Referring to FIG. 8D, at least a portion of features 24a and 26a of multi-layer substrate 64 may be exposed, as resist 78 substantially blocks (e.g., masks) processing of alignment marks 60a while the remaining features 24a and 26a are unblocked (e.g., unmasked). It should be noted that the steps shown in FIGS. 8C and 8D may be optional. For example, steps shown in FIGS. 8C and 8D may be used to limit the depth of alignment marks 60a.

Figure 8E:
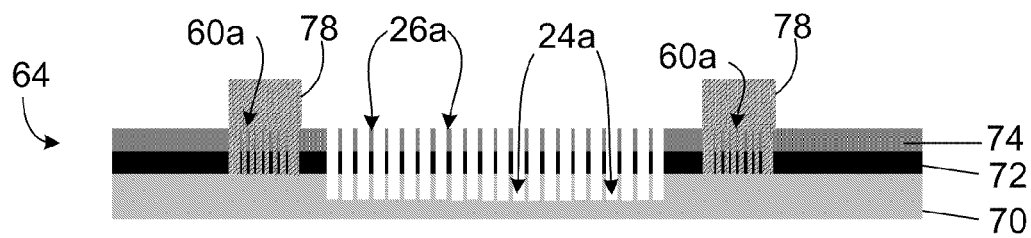

Features 24a and 26a of multi-layer substrate 64 may be further etched into substrate 70 as illustrated in FIG. 8E. As features 24a and 26a are further etched into substrate 70, resist 78 may substantially block the etch process from altering alignment marks 60a.

Figure 8F:
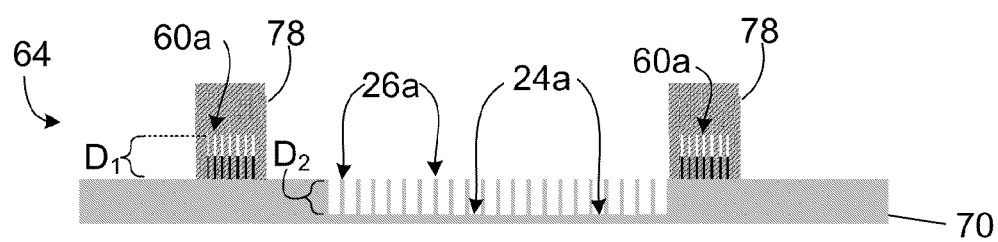

As illustrated in FIG. 8F, the multi-layered substrate 64 may further be substantially removed of contrast material layer 72 and hard mask layer 74. Contrast material layer 72 and/or hard mask layer 74 may be removed using techniques including, but not limited to, wet etching, RIE, ERIE, ICP, plasma etching, dry isotropic etching, and the like. For example, chromium based high contrast materials may be removed by wet etching with high selectivity using chromium etchants, such as, for example, Cr7S and Cr9S Chromium based films may also be removed with chlorine and $O_2$ based plasma processes.

The removal process may selectively remove contrast material layer 72 and/or hard mask layer 74 with minimal effects on features 24a and/or 26a. Additionally, as multi-layered substrate 64 is removed of contrast material layer 72 and/or hard mask layer 74, resist 78 may substantially block the removal process from altering alignment marks 60a. Protection provided by resist 78 during removal of contrast material layer 72 and/or hard mask layer 74 may provide alignment marks 60a to be independent from depth of the features 24a and 26a. For example, alignment mark 60a may have a depth $D_1$ while protrusions 26a may have a depth $D_2$, wherein $D_1 \neq D_2$. It should be noted that the step shown in FIG. 8F may be optional as contrast material layer 72 and/or hard mask layer 74 may remain over features 24 and 26.

Figure 8G:
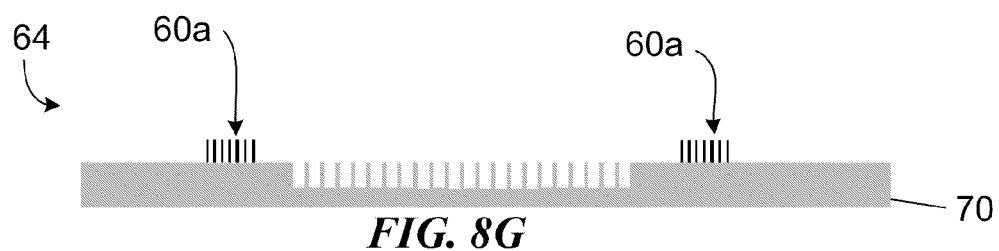

As illustrated in FIG. 8G, multi-layer substrate 64 may be further substantially stripped of resist 78. Additionally, hard mask layer 74, shielded by resist 78, may be substantially stripped to expose at least a portion of alignment marks 60a.

As illustrated in FIGS. 8H-8K, additional processing of multi-layer substrate 64 may provide sidewalls 80a functioning to assist in substantially confining polymerizable material 34 between template 18 and the substrate 12 in the desired volume during polymerization and/or cross-linking as described above (see FIG. 1). For example, sidewalls 80a may be formed by methods further described in U.S. patent application Ser. No. 11/762,378, now U.S. Pat. No. 7,473,090, which is hereby incorporated by reference. The resulting template 18 comprises mesa 20 having alignment marks 60a formed of contrast material. Sidewalls 80a may be formed prior to patterning of alignment marks 60a and/or formed subsequent to patterning of alignment marks 60a. For example, sidewalls 80a may be formed prior to patterning of alignment marks 60a such that sidewalls 80a may be formed from a single substrate in contrast to multi-layer substrate 64 which may simplify formation.

Figure 8H:
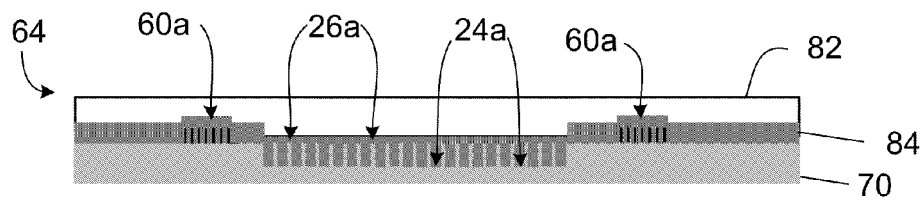
Figure 8I:
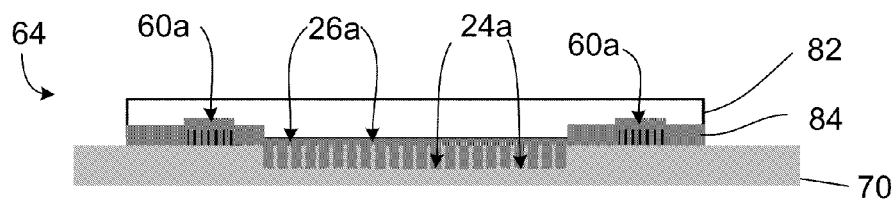
Figure 8J:
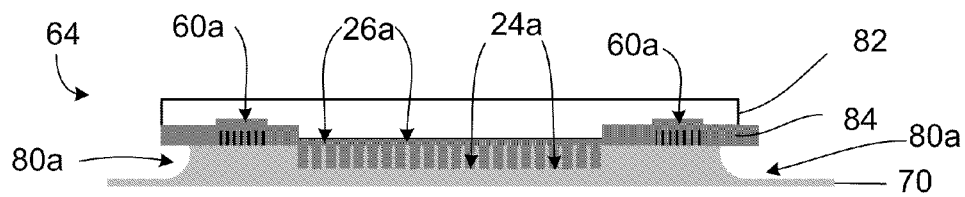
Figure 8K:
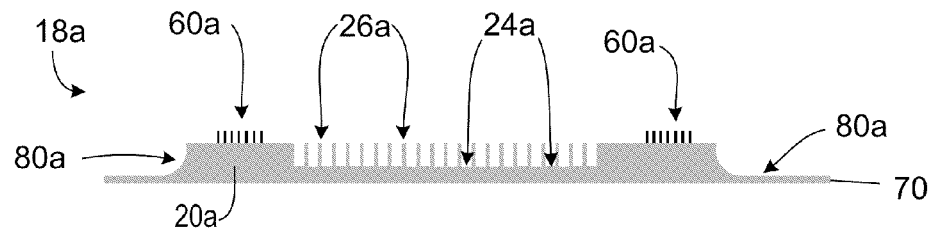

FIGS. 8H-8K illustrates an exemplary process wherein sidewalls 80a may be formed in multi-layer substrate 64 subsequent to patterning of alignment marks 60a. Multi-layer substrate 64 may be coated with a resist 82 and a hard mask layer 84 as illustrated by FIG. 8H. Portions of resist 82 and hard mask layer 84 are removed such that alignment marks 60a and features 24a and 26a remain substantially shielded by resist 82 and hard mask layer 84 as illustrated by FIG. 8I. During the steps shown in FIGS. 8J-8K, sidewalls 80a may be formed.

Figure 9A:
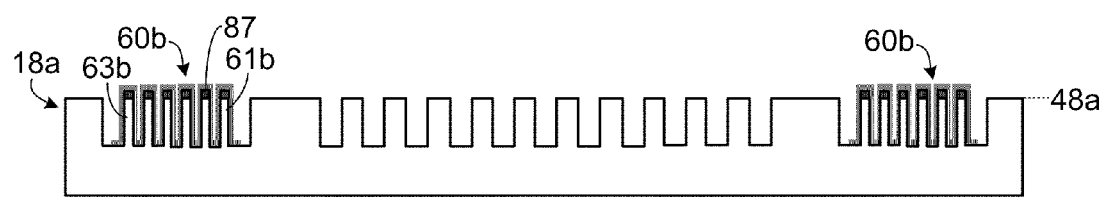
FIGS. 9A and 9B illustrate exemplary embodiments of templates having alignment marks that are visible during an alignment process, the alignment marks having a protective layer.
Figure 9B:
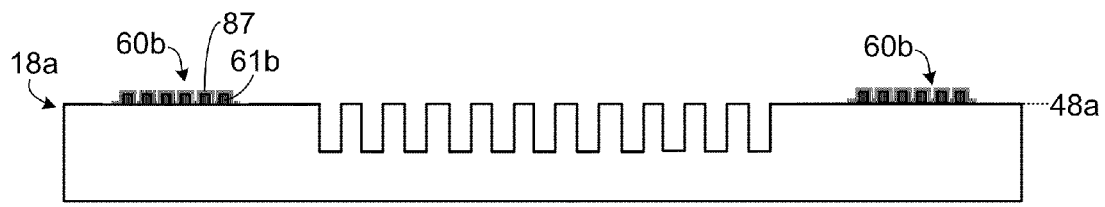

Referring to FIGS. 9A and 9B, an protective layer 87 may be used to form alignment marks 60b that are visible during the alignment process. Protective layer 87 may be localized within alignment mark 60b, or as illustrated in FIGS. 9A and 9B, protective layer 87 may coat alignment marks 60b. For example, in FIG. 9A, a first portion 61b of alignment mark 60b may include high contrast material, a second portion 63b of alignment mark 60b may be substantially free of high contrast material, and protective layer 87 may coat first portion 61b and second portion 63b of alignment mark 60b.

FIGS. 10A-10K illustrate simplified side views of another exemplary formation of template 18b from a multi-layered substrate 86b having a protective layer 87 (e.g., oxide layer). The resulting template 18b (see FIG. 10H) formed from multi-layer substrate 86b comprises mesa 20b having high-contrast alignment marks 60b. Additionally, formation of alignment marks 60b may be within the same processing step as formation of features 24b and/of 26b. Formation within the same processing step may reduce overlay alignment error.

Figure 10A:
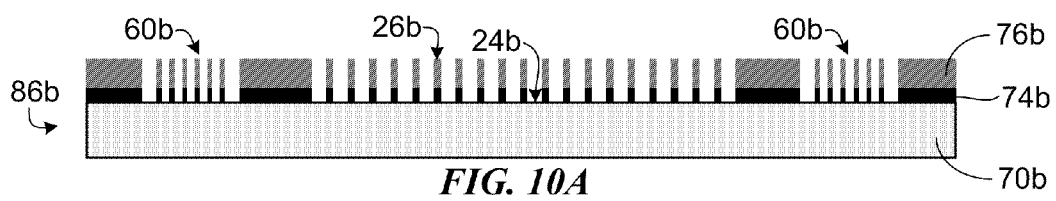
FIGS. 10A-10H illustrate another embodiment of exemplary template formation.
Figure 10B:
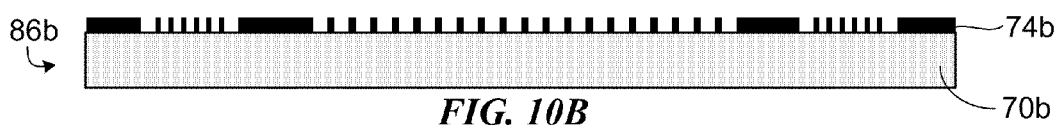
Figure 10C:
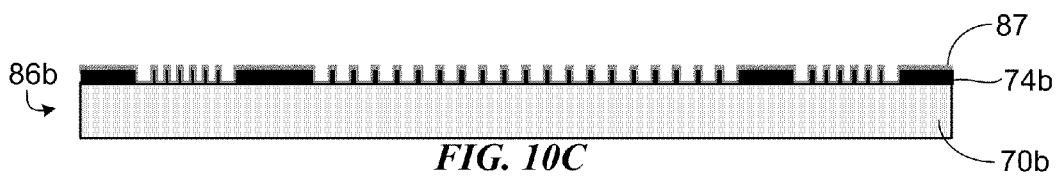
Figure 10D:
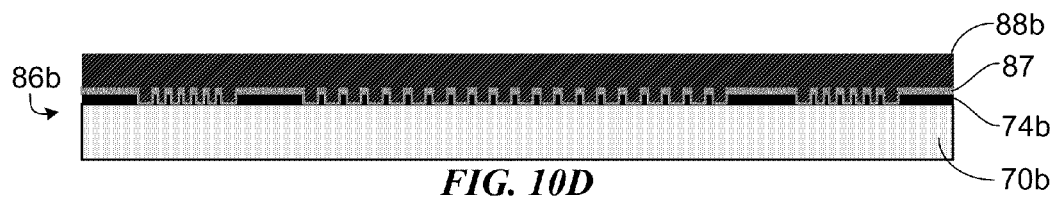
Figure 10E:
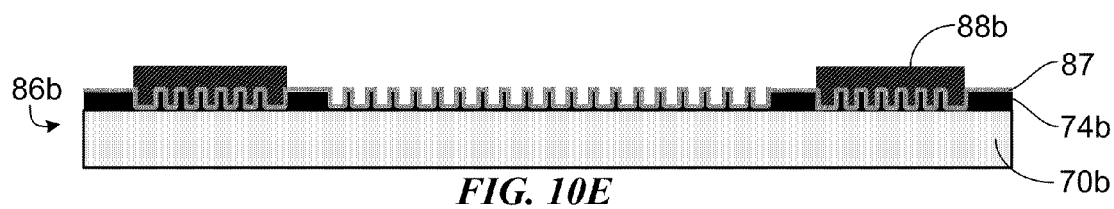

As illustrated in FIG. 10A, multi-layer substrate 86b may comprise a substrate layer 70b, a hard mask layer 74b, and a resist layer 76b, and may be patterned to include features 24b and 26b and/or alignment marks 60b. Multi-layer substrate 86 may be further substantially stripped of resist 76b as illustrated in FIG. 10B and recoated with protective layer 87 (e.g., oxide layer), as illustrated in FIG. 10C. A second resist layer 88b may then be placed to substantially shield alignment marks 60b as illustrated in FIG. 10D. Second resist layer 88b may be selectively etched such that a portion of second resist layer 88b protects alignment marks 60b as illustrated in FIG. 10E.

Figure 10F:
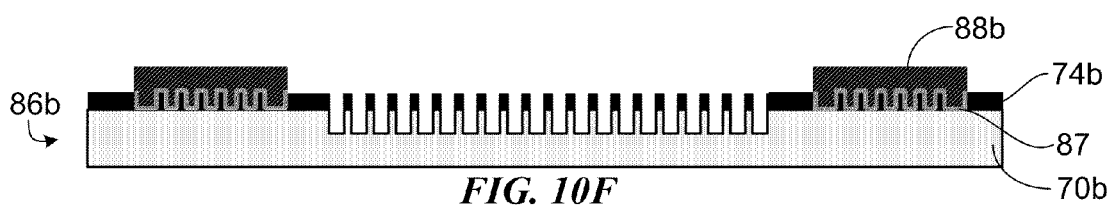
Figure 10G:
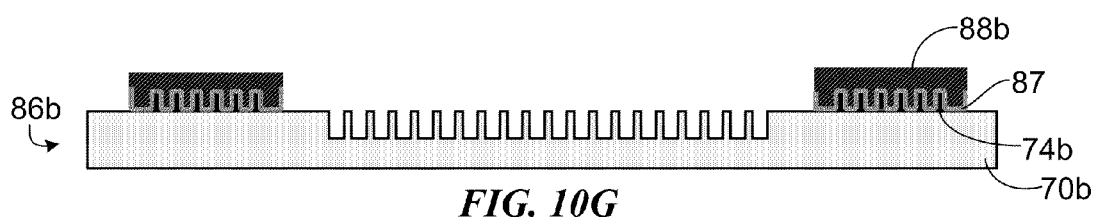

As illustrated in FIG. 10F, features 24b and 26b may be further etched into substrate 70. As illustrated in FIG. 10G, hard mask layer 74b may be removed. For example, hard mask layer 74b may be removed using techniques including, but not limited to, dry isotropic etching (e.g., xenon diflouride gas), wet etching (e.g., KOH), and the like.

Figure 10H:
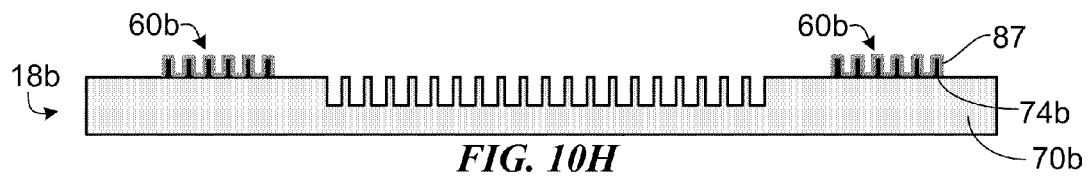

As illustrated in FIG. 10H, the multi-layer substrate 86 may be substantially stripped of resist 88 exposing alignment marks 60b to provide template 18b having alignment marks 60b wherein at least a portion of alignment marks 60 may be formed of high contrast material.

Additional processing of template 18b may provide sidewalls functioning to assist in substantially confining polymerizable material 34 between template 18b and substrate 12 in the desired volume during polymerization and/or cross-linking as described above (see FIG. 1). For example, sidewalls 80b may be formed by methods further described in U.S. Pat. No. 7,473,090 which is hereby incorporated by reference. It should be noted sidewalls may be formed prior to formation of features 24b and 26b and/or alignment marks 60b or sidewalls may be formed subsequent to formation of features 24b and 26b and/or alignment marks 60b.

Alignment marks having high contrast material may also be formed during replica patterning of device to have substantially the same pattern as a master template. Forming master templates using e-beam lithography or other methods may be time consuming and expensive. As such, replicas of the master template may be used as working templates. FIGS. 11A-11E, FIGS. 12A-12D and FIGS. 13A-13D illustrate exemplary replication processes to form replica templates 18d from master template 18c. Replica templates 18d include high contrast alignment marks 60c.

Figure 11A:
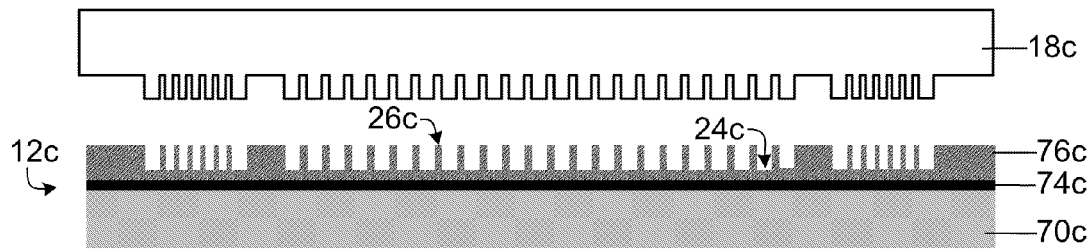
FIGS. 11A-11E, FIGS. 12A-12D and FIGS. 13A-13D illustrate exemplary replication processes to form replica templates having high contrast alignment marks.

For example, as illustrated in FIGS. 11A-11E, any standard photomask process may be used to create master template 18c including, but not limited to, variable shaped electron beam, Gaussian electron beam, laser writing and other similar processes. Master template 18c may then be used to form features 24c and 26c, as well as alignment marks 60c within substrate 12c as illustrated in FIG. 11A. For example, imprint lithography techniques, such as those described herein, may be used to form features 24c and 26c, as well as alignment marks 60c within substrate 12c.

Substrate 12c may include substrate layer 70c, resist layer 76c and a temporary hard mask layer 74c. Hard mask layer 74c may be used to improve resist exposure and etch pattern transfer depending on design considerations. It should be noted, and as described in detail above, hard mask layer 74c may be formed of high contrast material. Alternatively, a separate high contrast material layer may be used in conjunction with hard mask layer 74c to form replica template 18d.

Figure 11B:
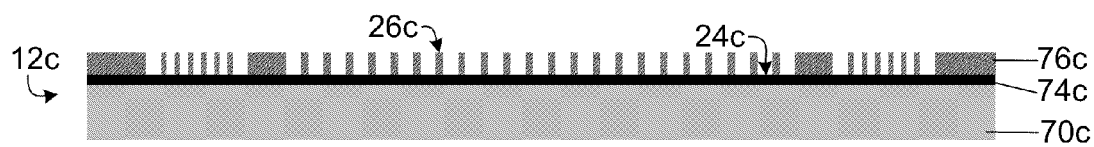
Figure 11C:
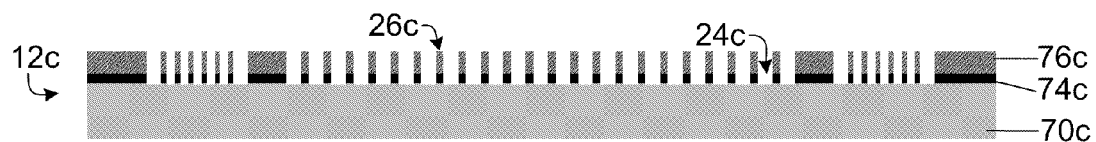
Figure 11D:
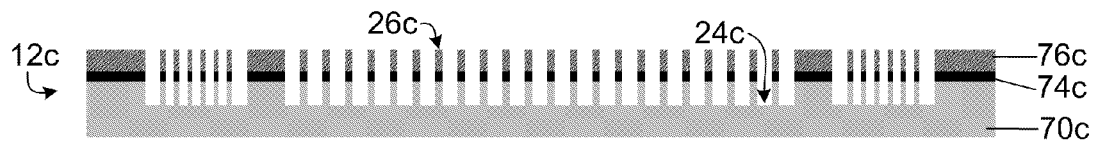
Figure 11E:
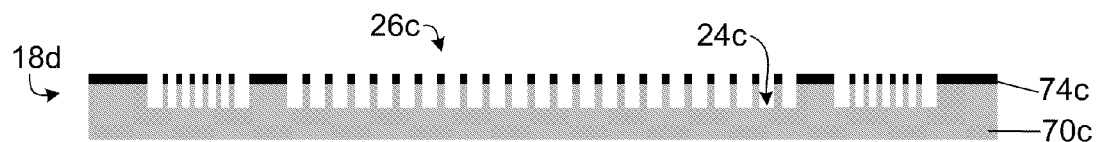

As illustrated in FIG. 11B, features 24c and 26c and/or alignment marks 60c may be further etched in hard mask layer 74c and/or substrate layer 70c. Portions of hard mask layer 74c may removed, as illustrated in FIG. 11C, and features 24c and 26c and/or alignment marks 60c further etched into substrate layer 70c. Resist may be removed to form replica template 18d having alignment marks 60c with at least a portion of alignment marks 60c being formed of high contrast material.

Replica template 18d may be further processed localizing high contrast material. For example, replica template 18d may be further processed such that only alignment marks 60c include high contrast material. FIGS. 12A-12D illustrate an exemplary process for localizing high contrast material in alignment marks 60c.

Figure 12A:
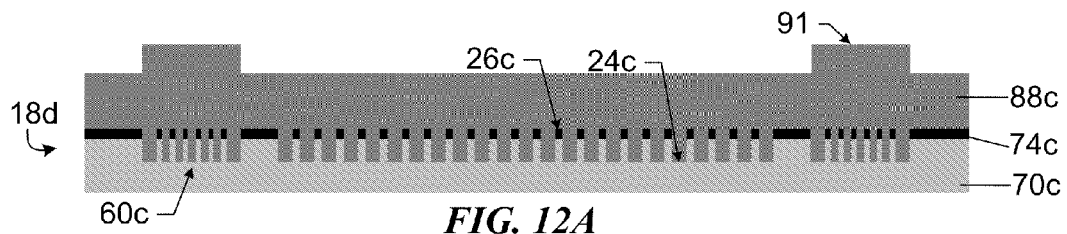

As illustrated in FIG. 12A, a second resist layer 88c may be positioned (e.g., imprinted) on replica template 18d. Second resist layer 88c may include one or more alignment blocks 91. Alignment blocks 91 may be positioned in superimposition with alignment marks 60c to substantially block removal of high contrast material from alignment marks 60 during etching and/or stripping.

Figure 12B:
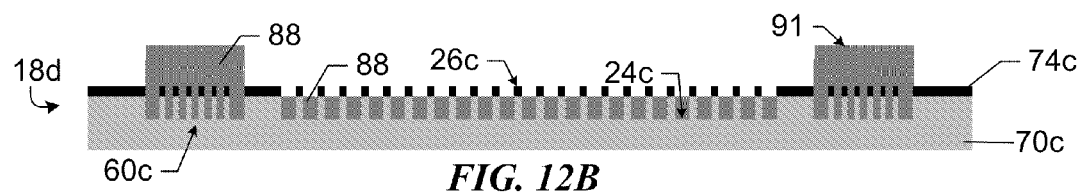
Figure 12C:
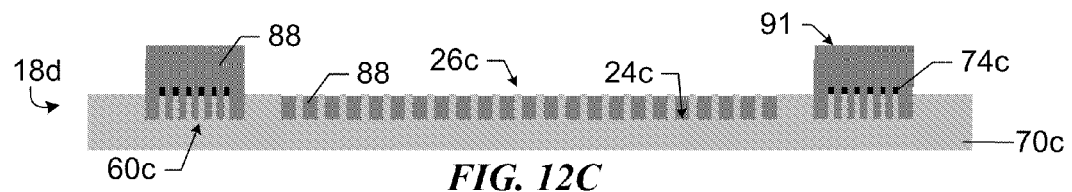
Figure 12D:
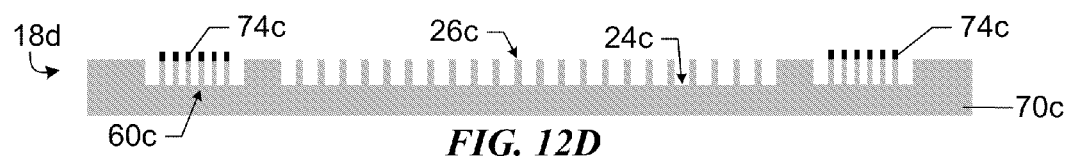

Referring to FIG. 12B, second resist layer 88c may be stripped exposing at least a portion of hard mask layer 74c of features 26c. Etching may remove a first portion of hard mask layer 74c as illustrated in FIG. 12C while alignment blocks 91 may block etching of at least a second portion of hard mask layer 74c. For example, alignment blocks 91 may block alignment marks 60c from having hard mask layer 74c removed. Resist layer 88c may then be removed providing replica template 18d having high contrast material localized in alignment marks 60c.

Figure 13A:
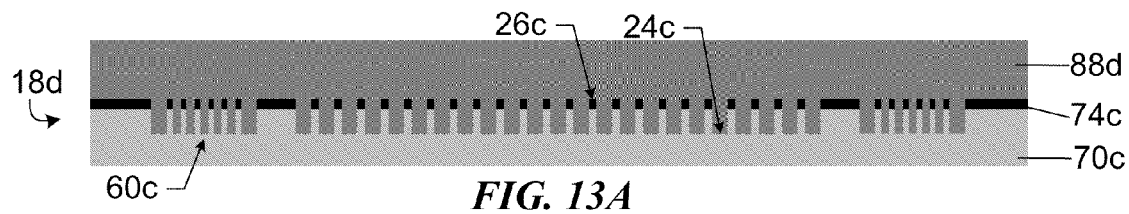
Figure 13B:
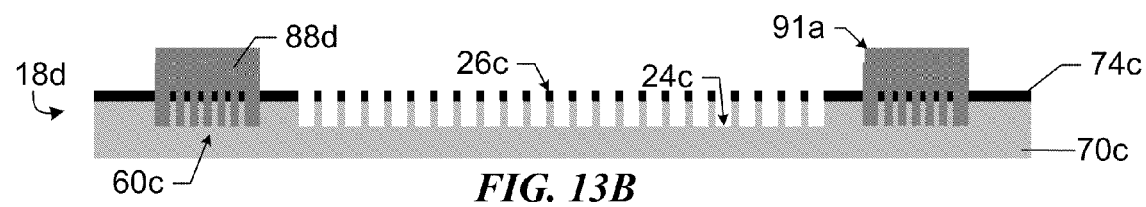
Figure 13C:
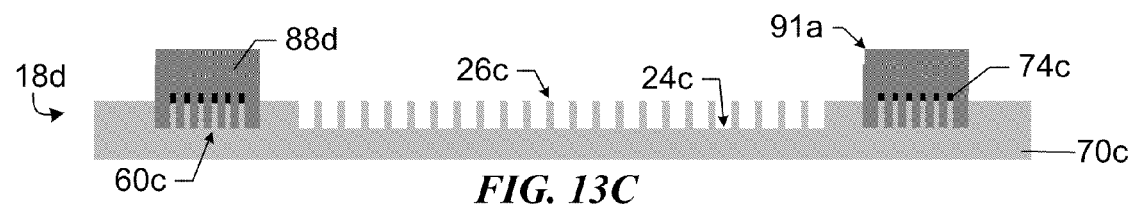
Figure 13D:
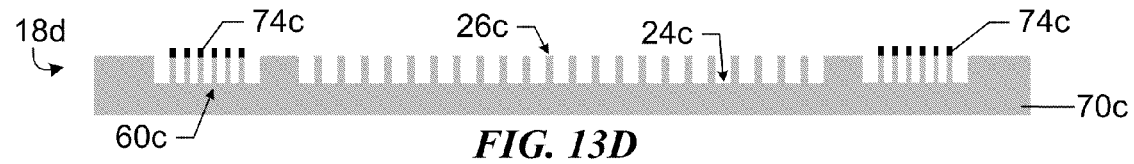

FIGS. 13A-13D illustrate another exemplary process for localizing high contrast material in alignment marks 60c of template 18d. As illustrated in FIG. 13A, a second resist layer 88d may be may be positioned on replica template 18d using techniques such as spin-coating. Second resist layer 88d may be developed to form alignment blocks 91a that substantially block alignment marks 60c from further processing. As illustrated in FIG. 13C, hard mask layer 74c may be stripped while alignment blocks 91a substantially block stripping of hard mask layer 74c of alignment marks 60c. Resist layer 88d may then be removed providing replica template 18d having high contrast material localized in alignment marks 60c.

Figure 14:
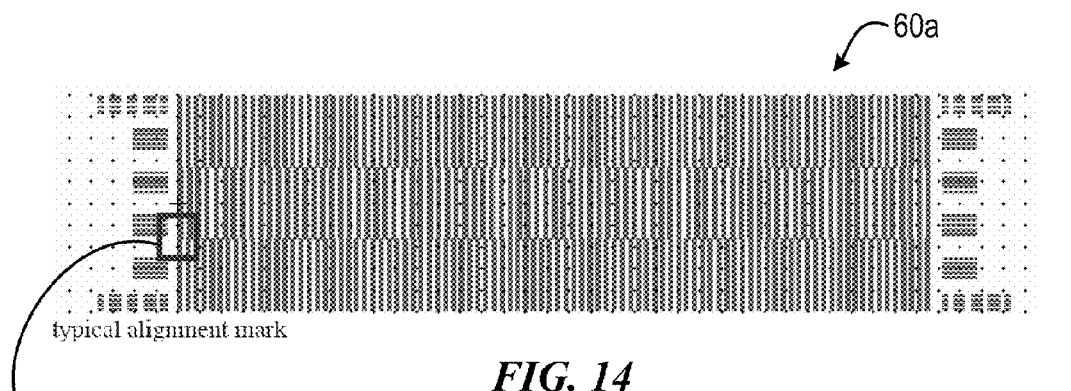
FIG. 14 illustrates a top down view of an alignment mark.
Figure 15A:
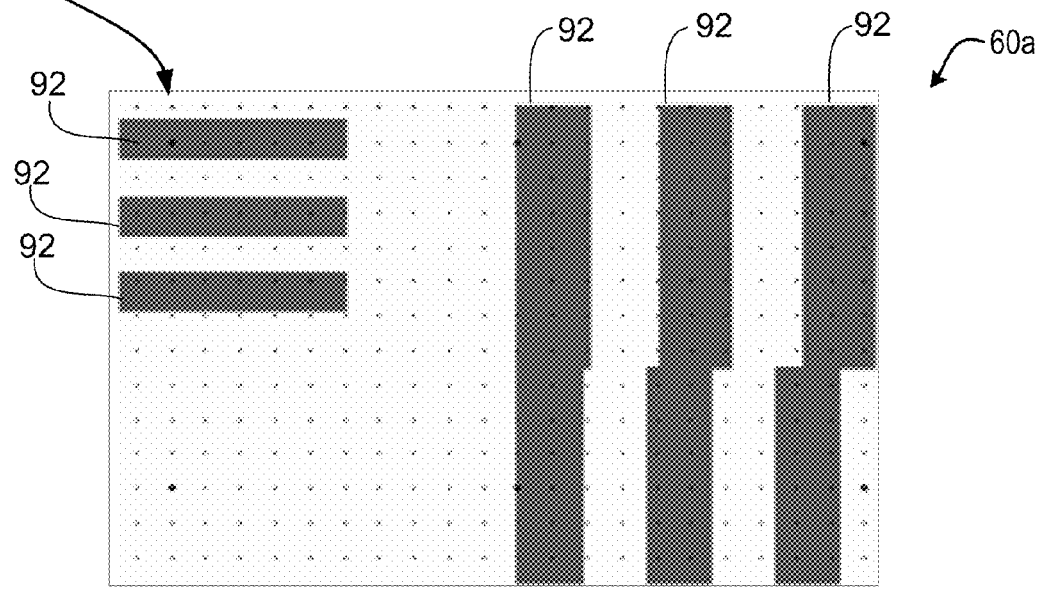
FIG. 15A illustrates a magnified view of one embodiment of an alignment mark.
Figure 15B:
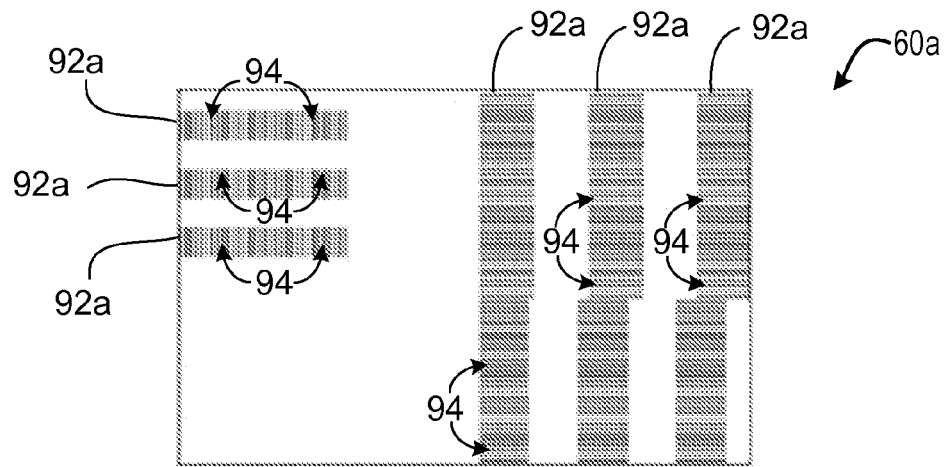
FIG. 15B illustrates a magnified view of another embodiment of an alignment mark, the alignment mark fragmented in a line space pattern.

Alignment marks 60a and/or 60b formed of contrast material may provide enough visibility to perform alignment even in the presence of polymerizable material 34. Additionally, as illustrated in FIG. 14 and FIGS. 15A and 15B, features 92 may be altered in an effort to pass more UV wavelength, while providing longer wavelengths of energy used for alignment to be absorbed, reflected, and/or diffracted. For example, as illustrated in FIG. 14 and more particularly in FIG. 15A, alignment marks 60a may generally have features 92 around 1 µm in width. These features 92 may be fragmented into small repeating sub-features 94 ranging in size from 50 nm to 200 nm. Fragmentation of alignment marks 60a may reduce the contact area of the contrast material to polymerizable material 34 (see FIG. 1) during curing.

Figure 15C:
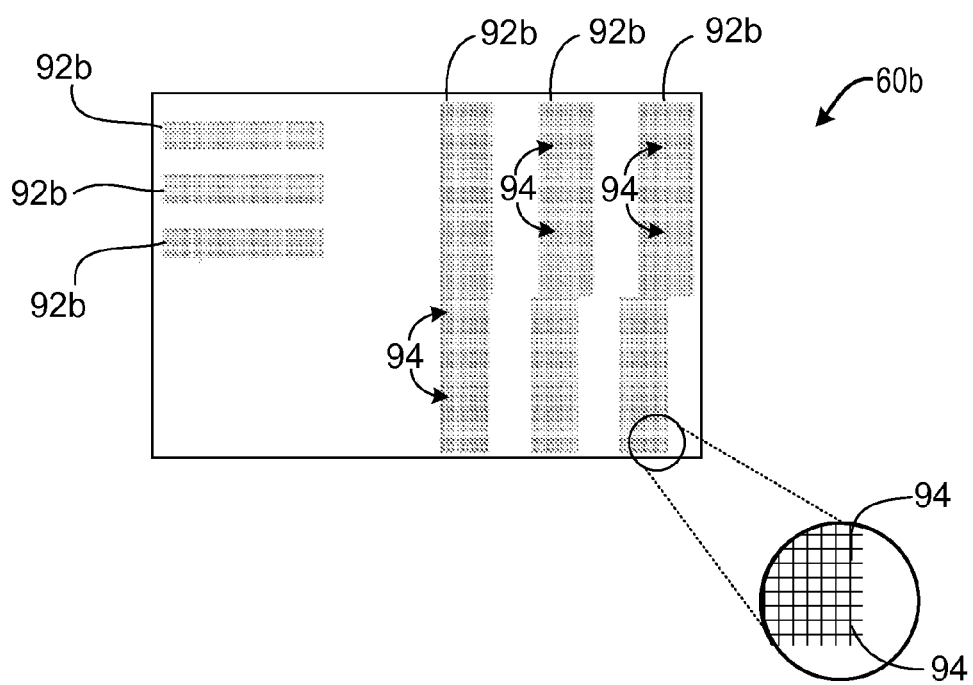
FIG. 15C illustrates a magnified view of another embodiment of an alignment mark, the alignment mark fragmented in a square grid pattern.

FIGS. 15B and 15C illustrate two embodiments of alignment marks 60a and 60b having altered pitch. In FIG. 15B, features 92a of alignment mark 60a are fragmented by line space to provide repeating line sub-features 94 ranging in size from 50 nm to 200 nm. In FIG. 15C, features 92b of alignment mark 60b are fragmented in square grid pattern sub-features 94 providing repeating squares ranging in size from 50 nm to 200 nm.

Figure 16:
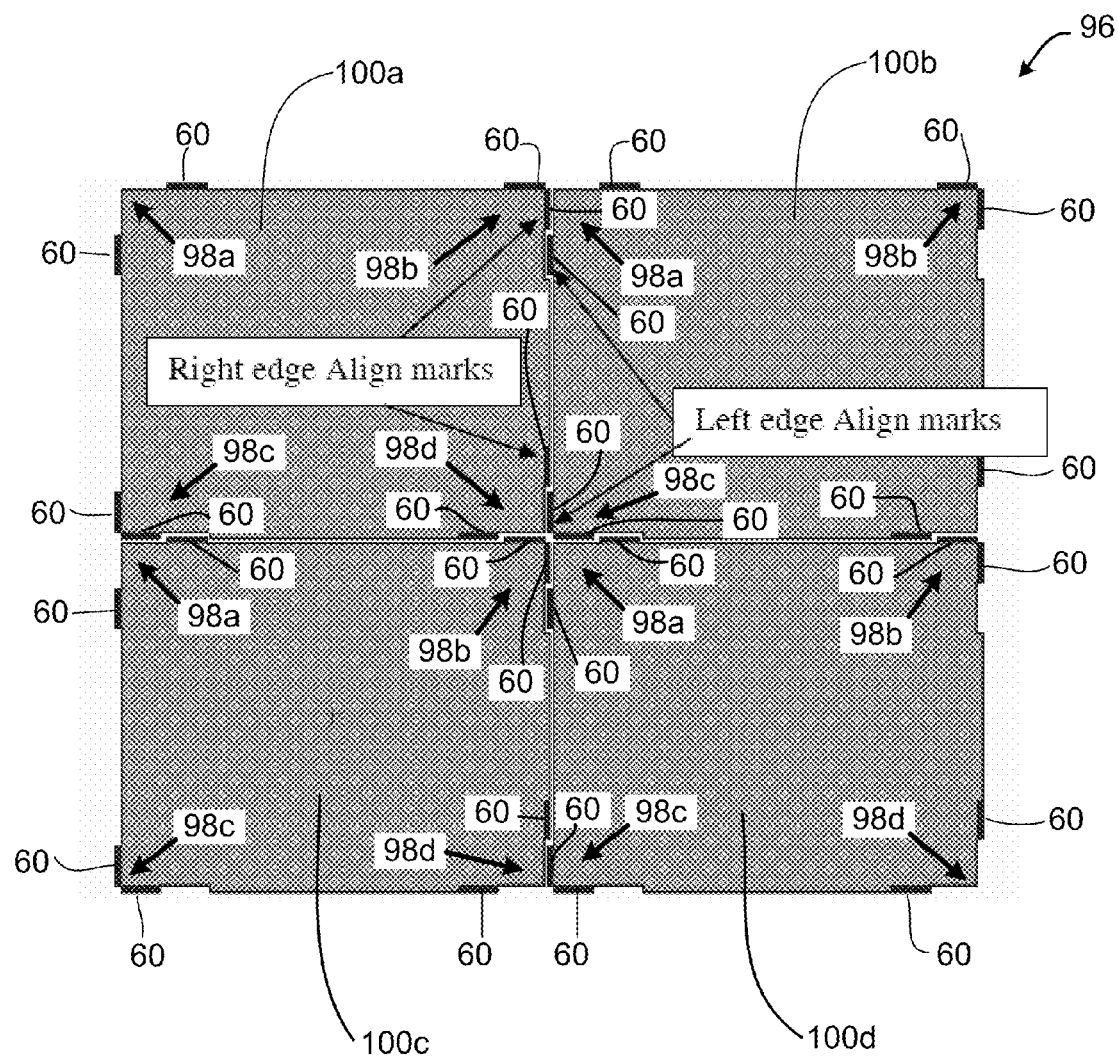
FIG. 16 illustrates alignment marks staggered in a lock and key arrangement on an imprint field.

Space allocation for alignment marks 60 may be further reduced by staggering alignment marks 60. For example, as illustrated in FIG. 16, alignments marks 60 are staggered in a lock and key arrangement on an imprint field 96. The staggered layout on the imprint field 96 may utilize the same horizontal scribe spacing for alignment marks 60 placed in the top and bottom perimeter edges of the field 96. Similarly, the same vertical scribe spacing may be used for the alignment marks 60 placed in the left and right perimeter edges of the field 96. The staggered layout reduces the scribe width while maintaining alignment marks 60 in each of the four corners 98a, 98b, 98c, and 98d of each section 100a-100d of the imprint field 96. For example, alignment marks 60 in corners 98b and 98d of section 100a align in a lock and key arrangement with alignment marks 60 in corners 98a and 98c of section 100b. In a related matter, alignment marks 60 in corners 98c and 98d of section 100a align in a lock and key arrangement with alignment marks 60 in corners 98a and 98b of section 100c.

The staggered layout on the imprint field 96 may include the use of alignment marks 60 formed of contrast material. Additionally, or in lieu of the high-contrast material, the staggered layout on the imprint field 96 may include the use of moats as described in U.S. patent application Ser. No. 10/917,761, which is hereby incorporated by reference.

What is claimed is:

1. A method of patterning an imprint nano-lithography substrate, comprising:
    patterning a first portion of the substrate with a plurality of recessions and a plurality of protrusions;
    patterning a second portion of the substrate with at least one alignment mark, at least a portion of the alignment mark being formed of high contrast material, wherein the patterning of the second portion includes depositing high contrast material on the alignment mark and wherein the high contrast material is localized solely at a patterning surface of the alignment mark; and,
    wherein the first portion of the substrate and the second portion of the substrate are patterned within the same step.

2. The method of claim 1, wherein an etch depth of the first portion of the substrate is independent of an etch depth of the second portion of the substrate.

3. The method of claim 2, wherein patterning of the first portion of the substrate further includes applying a resist layer in superimposition with the second portion of the substrate such that the etch depth of the first portion of the substrate is independent of the etch depth of the second portion of the substrate.

4. The method of claim 1, wherein the alignment mark includes a protective layer positioned adjacent to the high contrast material.

5. The method of claim 4, wherein the protective layer is an oxide layer.

6. The method of claim 1, wherein the substrate includes the high contrast material and patterning of the second portion includes etching of substrate including the high contrast material to form the alignment mark.

7. The method of claim 6, wherein the substrate further includes a hard mask layer.

8. The method of claim 1, wherein the alignment marks are fragmented.

9. The method of claim 8, wherein the alignment marks are fragmented by line space.

10. The method of claim 8, wherein the alignment marks are fragmented in a square grid pattern.

11. The method of claim 1, wherein formation of the alignment marks are staggered in a lock and key arrangement on an imprint field.

12. The method of claim 1, wherein the first portion of the substrate and the second portion of the substrate are patterned to form a replica template.

13. The method of claim 1, wherein the substrate is a nano-lithographic template.

14. The method of claim 1, wherein at least a portion of the protrusions include high contrast material.

15. A method of patterning an imprint nano-lithography substrate, comprising:
    patterning a first portion of the substrate with a plurality of recessions and a plurality of protrusions;
    patterning a second portion of the substrate with at least one alignment mark, at least a portion of the alignment mark being formed of high contrast material, wherein the high contrast material is localized solely at a patterning surface of the alignment mark;
    patterning a sidewall on the substrate; and,
    wherein the first portion of the substrate and the second portion of the substrate are patterned within the same step.

16. The method of claim 15, wherein the sidewall is patterned on the substrate prior to patterning of the first portion of the substrate.

17. The method of claim 15, wherein the sidewall is patterned on the substrate subsequent to patterning of the first portion of the substrate.

* * * * *